United States Patent
Lin

(10) Patent No.: US 7,199,063 B2
(45) Date of Patent: Apr. 3, 2007

(54) PROCESS FOR PASSIVATING POLYSILICON AND PROCESS FOR FABRICATING POLYSILICON THIN FILM TRANSISTOR

(76) Inventor: Ching-Wei Lin, No. 212, Longshan St., Taoyuan City, Taoyuan County, 330 (TW)

(*) Notice: Subject to any disclaimer, the term of this patent is extended or adjusted under 35 U.S.C. 154(b) by 146 days.

(21) Appl. No.: 10/678,908

(22) Filed: Oct. 3, 2003

(65) Prior Publication Data
US 2004/0224530 A1  Nov. 11, 2004

(30) Foreign Application Priority Data
May 8, 2003 (TW) .............................. 92112533 A

(51) Int. Cl.
*H01L 21/302* (2006.01)
*H01L 21/461* (2006.01)
(52) U.S. Cl. ................ 438/765; 438/766; 257/E21.592
(58) Field of Classification Search ................ 438/765, 438/766, 774; 257/E21.592
See application file for complete search history.

(56) References Cited

U.S. PATENT DOCUMENTS

| | | | | |
|---|---|---|---|---|
| 5,137,839 A | * | 8/1992 | Niitsu | ........................ 438/310 |
| 5,534,445 A | * | 7/1996 | Tran et al. | ................... 438/162 |
| 5,840,600 A | * | 11/1998 | Yamazaki et al. | .......... 438/151 |
| 6,172,322 B1 | * | 1/2001 | Shang et al. | ........... 219/121.43 |
| 2001/0021565 A1 | * | 9/2001 | Chung et al. | ................ 438/398 |

OTHER PUBLICATIONS

IBM Tech. Discl. Bull. NN7908935, vol. 22, No. 3, p. 935 (Aug. 1, 1979).*

* cited by examiner

*Primary Examiner*—Caridad Everhart
(74) *Attorney, Agent, or Firm*—Quintero Law Office

(57) ABSTRACT

A process for passivating polysilicon and a process for fabricating a polysilicon thin film transistor. A polysilicon layer is formed. Next, high-pressure annealing is performed using a fluorine-containing gas, a chlorine-containing gas, an oxygen-containing gas, a nitrogen-containing gas, or mixtures thereof to passivate the polysilicon layer.

16 Claims, 9 Drawing Sheets

PROCESS FOR PASSIVATING POLYSILICON AND PROCESS FOR FABRICATING POLYSILICON THIN FILM TRANSISTOR

BACKGROUND OF THE INVENTION

1. Field of the Invention

The present invention relates to a process for passivating polysilicon, and more particularly to a process for passivating polysilicon by means of high pressure annealing using a fluorine-containing gas, a chlorine-containing gas, an oxygen-containing gas, a nitrogen-containing gas, or mixtures thereof for fabrication of polysilicon thin film transistors.

2. Description of the Prior Art

In polysilicon thin film transistors (p-Si TFTs), the grain boundary of polysilicon or the defect density in the grains plays an important role in the electric properties of TFTs. Reducing the defect density can greatly enhance the electric properties of the TFTs. One method of reducing the defect density is to increase the polysilicon grain size and crystallinity. Another method is to introduce other atomic components into polysilicon to fill in the defects, this process is generally referred to as passivation.

Due to small volume and high diffusion rate, hydrogen atoms have been used frequently to passivate polysilicon to fill the defective atoms. Such passivation is referred to as hydrogenation. Hydrogen atoms, however, diffuse out at high temperature, rendering the previous hydrogenation ineffective. Therefore, after hydrogenation, the device generally cannot be subjected to a process with higher temperature (such as 450° C.). Therefore, hydrogenation is generally performed when the device is almost completed. However, at this time, there are several layers of coating on the polysilicon thin film channel, which greatly reduces the hydrogenation efficiency. In addition, the bonding between hydrogen and silicon atoms is very weak, and easily broken during device operation. Therefore, using hydrogen atoms to fill in defects frequently reduces device reliability.

SUMMARY OF THE INVENTION

An object of the present invention is to solve the above-mentioned problems and provide a process for passivating polysilicon, which increases the passivation efficiency and shortens the passivation time.

Another object of the present invention is to provide a process for fabricating a polysilicon thin film transistor, which enhances the electric properties of the thin film transistor and increases yield, uniformity and reliability of thin film transistors.

To achieve the above objects, the process for passivating polysilicon of the present invention includes the following steps. A polysilicon layer is formed. Next, annealing is performed using a fluorine-containing gas, a chlorine-containing gas, an oxygen-containing gas, a nitrogen-containing gas, or mixtures thereof to passivate the polysilicon layer.

According to a first preferred embodiment of the present invention, the process for fabricating a polysilicon thin film transistor includes the following steps. First, a polysilicon layer is formed on a substrate. Then, high pressure annealing is directly performed without forming other films, in which fluorine-containing gas, a chlorine-containing gas, an oxygen-containing gas, a nitrogen-containing gas, or mixtures thereof are used to passivate the polysilicon layer.

According to a second preferred embodiment of the present invention, the process for fabricating a polysilicon thin film transistor includes the following steps. First, a polysilicon layer is formed on a substrate. Next, a gate dielectric layer is formed on the polysilicon layer. Finally, high pressure annealing is performed using a fluorine-containing gas, a chlorine-containing gas, an oxygen-containing gas, a nitrogen-containing gas, or mixtures thereof to passivate the polysilicon layer.

According to a third preferred embodiment of the present invention, the process for fabricating a polysilicon thin film transistor includes the following steps. First, a polysilicon layer is formed on a substrate. Next, a gate dielectric layer is formed on the polysilicon layer. Next, a gate is formed on the gate dielectric layer, and the polysilicon layer is doped to form source/drain regions. Finally, high pressure annealing is performed using a fluorine-containing gas, a chlorine-containing gas, an oxygen-containing gas, a nitrogen-containing gas, or mixtures thereof to passivate the polysilicon layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The feature of the present invention resides in that the atom used is able to form a stronger bond with a silicon atom, such as F, N, or O, to fill in the polysilicon defect. Specifically, high pressure annealing is performed using a fluorine-containing gas, a chlorine-containing gas, an oxygen-containing gas, a nitrogen-containing gas, or mixtures thereof to passivate the polysilicon layer. Thus, a polysilicon thin film transistor with better electric properties and reliability can be obtained. The timing and/or sequence of passivating the polysilicon layer is not limited. Passivation can be performed directly after the polysilicon layer is formed without forming other films. Or, passivation can be performed after the polysilicon layer and the gate dielectric layer are formed. Or, passivation can be performed after the polysilicon layer, the gate dielectric layer, and the gate are formed. Or, passivation can be performed after the polysilicon layer, the gate dielectric layer, the gate, and the source/drain regions are formed. Passivation of the polysilicon layer at different timings is described below with reference to several embodiments.

FIGS. 1a to 1e are cross-sections illustrating the process flow of fabricating a polysilicon thin film transistor according to a first preferred embodiment of the present invention. This embodiment shows the condition of performing passivation directly after the polysilicon layer is formed without forming other films. First, referring to FIG. 1a, a buffer layer 12 and an amorphous silicon layer 20 are formed sequentially on a substrate 10. Next, the amorphous silicon layer 20 is crystallized (labeled C) to transform the amorphous silicon layer 20 into a polysilicon layer (not shown).

The buffer layer 12 can be a silicon nitride layer, a silicon oxide layer, or a combination thereof. The amorphous silicon layer 20 can be formed by plasma-enhanced chemical vapor deposition (PECVD) or low pressure chemical vapor deposition (LPCVD) using silane ($SiH_4$) as reactant gas.

Various conventional processes can be used for crystallization, including low temperature excimer laser annealing (ELA), high temperature solid phase crystallization (SPC), continuous grain growth (CGC), metal induced crystallization (MIC), metal induced lateral crystallization (MILC), and sequential lateral solidification (SLS).

Figure 1A:
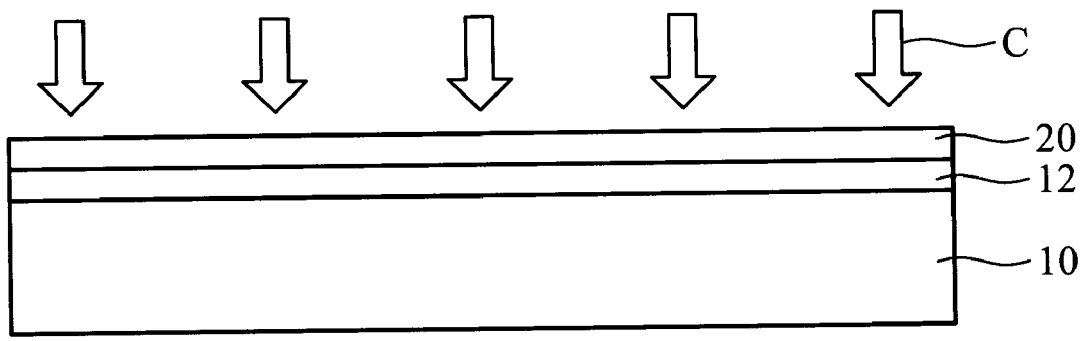
FIGS. 1a to 1e are cross-sections illustrating the process flow of fabricating a polysilicon thin film transistor according to a first preferred embodiment of the present invention.
Figure 1B:
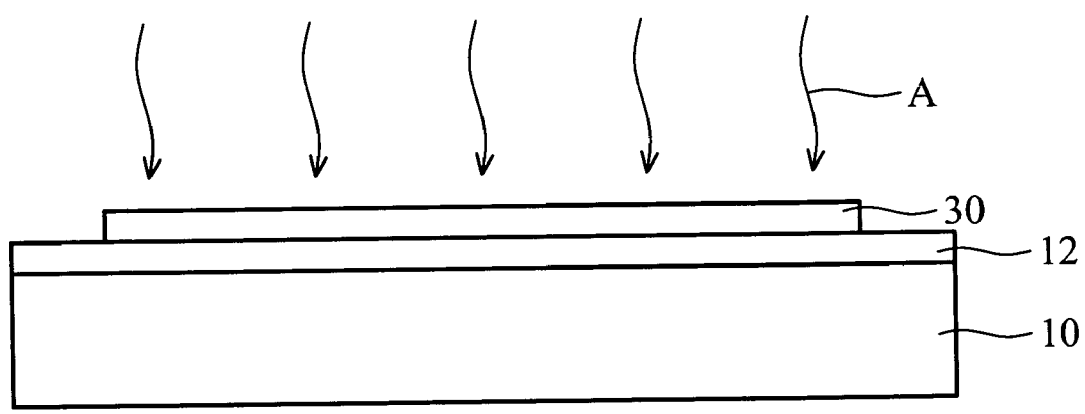
Figure 1C:
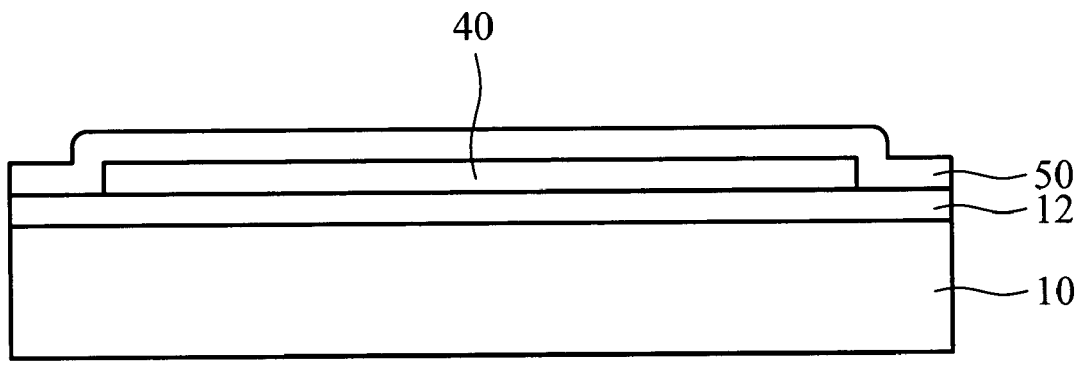
Figure 1D:
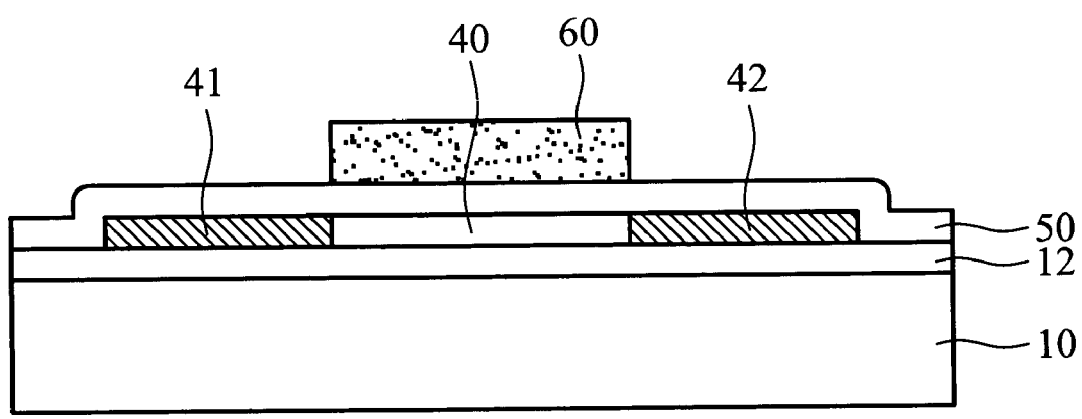

Subsequently, referring to FIG. 1b, after crystallization (C), the polysilicon layer is patterned by photolithography and etching to obtain a polysilicon layer 30. Next, annealing (A) is directly performed using a fluorine-containing gas, a chlorine-containing gas, an oxygen-containing gas, a nitrogen-containing gas, or mixtures thereof to passivate the polysilicon layer 30, obtaining a passivated polysilicon layer 40 (as shown in FIG. 1c) without forming other films. The annealing step (A) is preferably high pressure annealing, that is, preferably performed at a pressure higher than 1 atm, more preferably at a pressure of 1 atm to 20 atm, most preferably at a pressure of 2 atm to 20 atm. Moreover, the high pressure annealing is preferably performed at a temperature of 300° C. to 600° C. Fluorine-containing gas suitable for use in the present invention can be $NF_3$ and $F_2$, suitable chlorine-containing gas can be $Cl_2$, suitable oxygen-containing gas can be $O_2$, and suitable nitrogen-containing gas can be $N_2O$. Since F has a very strong bonding to Si, and the bonding is resistant to high temperature, it is particularly suitable to use $NF_3$, $F_2$, or a mixed gas thereof in the present invention to passivate the polysilicon layer 30.

Since F, N or O forms a strong bond with the silicon atom and can withstand the subsequent high temperature process, the passivation of this embodiment can be directly performed after amorphous silicon is crystallized to form polysilicon. Thus, the passivating gas fills in the broken bonds of polysilicon without passing through other films, greatly increasing passivation efficiency. Moreover, strong bonding between F, N, or O and the silicon atom also increases reliability during device operation.

Subsequently, referring to FIG. 1c, a gate dielectric layer 50 is formed on the passivated polysilicon layer 40. Next, referring to FIG. 1d, a metal layer (not shown) is formed and is then subjected to photolithography and etching to form a gate layer 60. Next, the passivated polysilicon layer 40 is doped using the gate layer 60 as a mask to form source/drain regions 41 and 42.

Figure 1E:
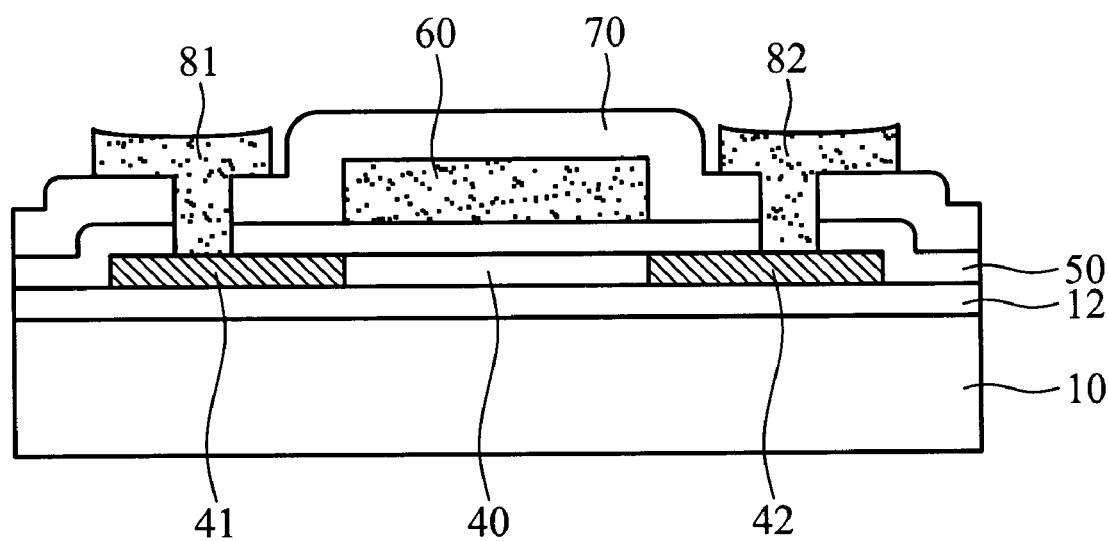

Subsequently, referring to FIG. 1e, an interlayer dielectric layer 70 is formed and an opening is formed in the interlayer dielectric layer 70 reaching the source/drain regions 41 and 42. Next, metal is filled in the opening of the interlayer dielectric layer 70 to form source/drain electrodes 81 and 82.

FIGS. 2a to 2e are cross-sections illustrating the process flow of fabricating a polysilicon thin film transistor according to a second preferred embodiment of the present invention. This embodiment shows the conditions under which passivation is performed after formation of the polysilicon layer and the gate dielectric layer. First, referring to FIG. 2a, a buffer layer 12 and an amorphous silicon layer 20 are formed sequentially on a substrate 10. Next, the amorphous silicon layer 20 is crystallized (labeled C) to transform the amorphous silicon layer 20 into a polysilicon layer (not shown). Representative examples of the buffer layer 12 and the amorphous silicon layer 20 and the passivation have been described above; therefore, detailed descriptions are omitted here.

Figure 2A:
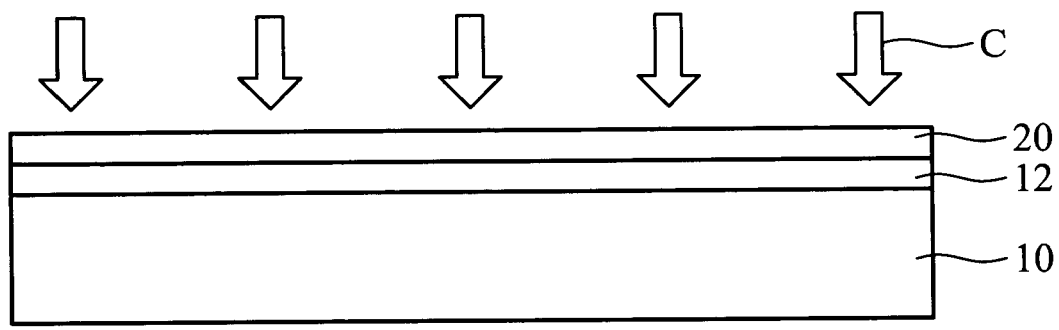
FIGS. 2a to 2e are cross-sections illustrating the process flow of fabricating a polysilicon thin film transistor according to a second preferred embodiment of the present invention.
Figure 2B:
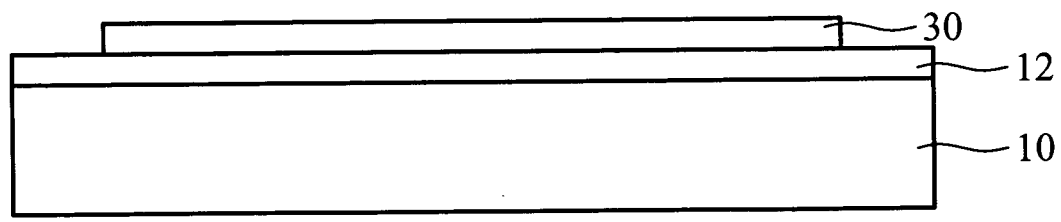

Subsequently, referring to FIG. 2b, after crystallization (C), the polysilicon layer is patterned by photolithography and etching techniques to obtain a polysilicon layer 30.

Figure 2C:
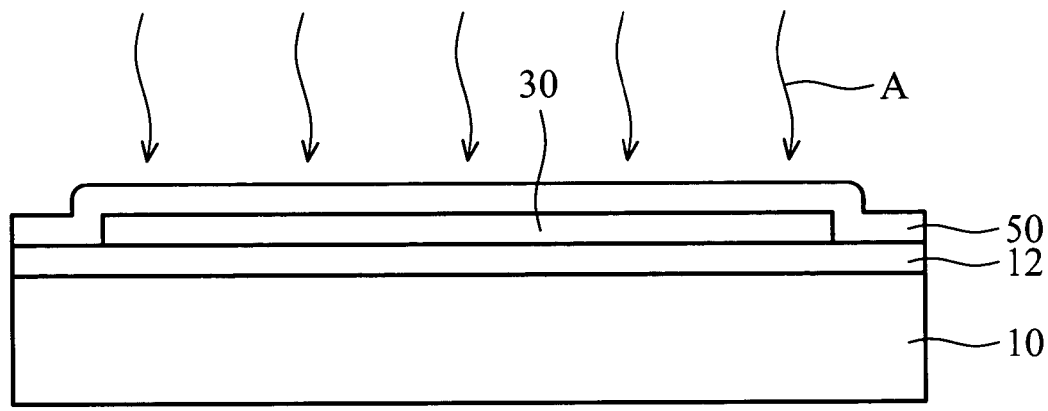
Figure 2D:
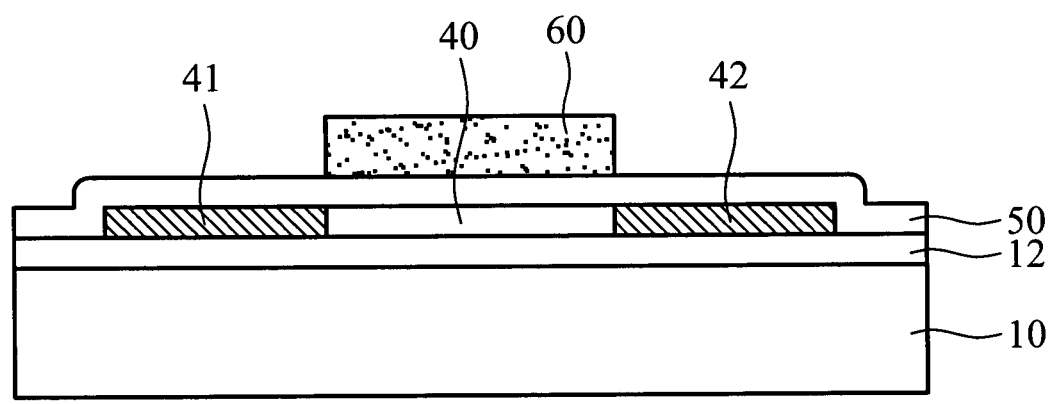

Subsequently, referring to FIG. 2c, a gate dielectric layer 50 is formed on the polysilicon layer 30. Next, the passivation of the present invention is performed. That is, annealing (A) using a fluorine-containing gas, a chlorine-containing gas, an oxygen-containing gas, a nitrogen-containing gas, or mixtures thereof is performed, thus passivating the polysilicon layer 30 to form a passivated polysilicon layer 40 (as shown in FIG. 2d). The annealing step (A) is preferably high pressure annealing, that is, preferably performed at a pressure higher than 1 atm, more preferably at a pressure of 1 atm to 20 atm, most preferably at a pressure of 2 atm to 20 atm. Moreover, the high pressure annealing is preferably performed at a temperature of 300° C. to 600° C. Fluorine-containing gas suitable for use in the present invention can be $NF_3$ and $F_2$, a suitable chlorine-containing gas can be $Cl_2$, a suitable oxygen-containing gas can be $O_2$, and a suitable nitrogen-containing gas can be $N_2O$. Since F forms a strong bond with Si, and the bond is resistant to high temperature, it is particularly suitable to use $NF_3$, $F_2$, or a mixed gas thereof in the present invention to passivate the polysilicon layer 30.

In this embodiment, the high pressure annealing is performed to passivate the polysilicon layer 30 after the polysilicon layer 30 and the gate dielectric layer 50 are formed. Thus, the broken bonds at the polysilicon layer 30 and the broken bonds at the interface between the gate dielectric layer 50 and the polysilicon layer 30, which are formed during the formation of the polysilicon layer 30, are passivated.

Subsequently, referring to FIG. 2d, a metal layer (not shown) is formed and is then subjected to photolithography and etching to form a gate layer 60. Next, the passivated polysilicon layer 40 is doped using the gate layer 60 as a mask to form source/drain regions 41 and 42.

Figure 2E:
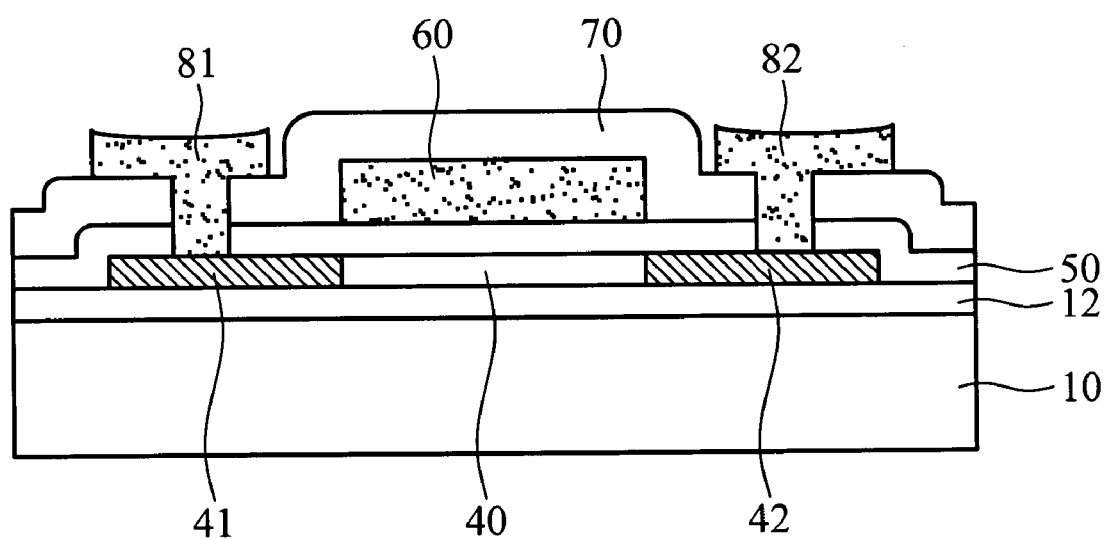

Subsequently, referring to FIG. 2e, an interlayer dielectric layer 70 is formed and an opening is formed in the interlayer dielectric layer 70 reaching the source/drain regions 41 and 42. Next, metal is filled in the opening of the interlayer dielectric layer 70 to form source/drain electrodes 81 and 82.

FIGS. 3a to 3e are cross-sections illustrating the process flow of fabricating a polysilicon thin film transistors according to a third preferred embodiment of the present invention. This embodiment shows the conditions under which passivation is performed after formation of the polysilicon layer, the gate dielectric layer, the gate, and the source/drain regions. First, referring to FIG. 3a, a buffer layer 12 and an amorphous silicon layer 20 are formed sequentially on a substrate 10. Next, the amorphous silicon layer 20 is crystallized (labeled C) to transform the amorphous silicon layer 20 into a polysilicon layer (not shown). Representative examples of the buffer layer 12 and the amorphous silicon layer 20 and the passivation have been described above; therefore, detailed descriptions are omitted here.

Figure 3A:
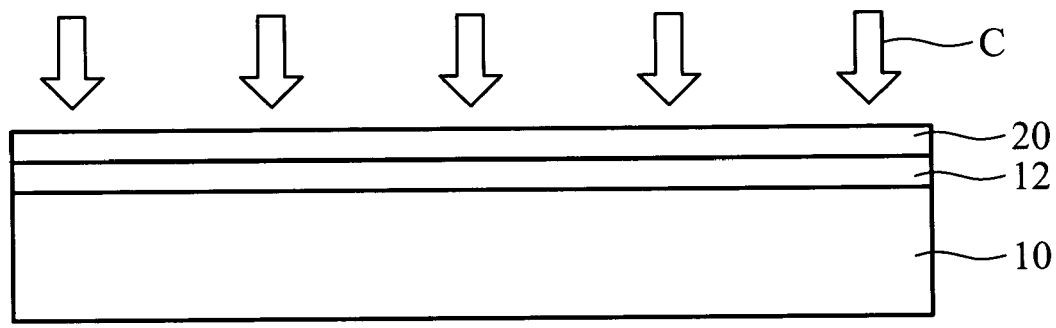
FIGS. 3a to 3e are cross-sections illustrating the process flow of fabricating a polysilicon thin film transistor according to a third preferred embodiment of the present invention.
Figure 3B:
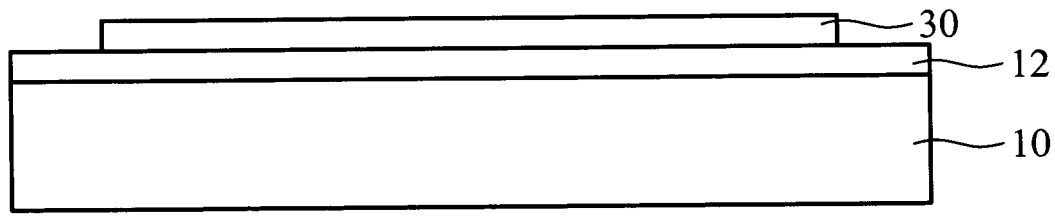

Subsequently, referring to FIG. 3b, after crystallization C, the polysilicon layer is patterned by photolithography and etching techniques to obtain a polysilicon layer 30.

Figure 3C:
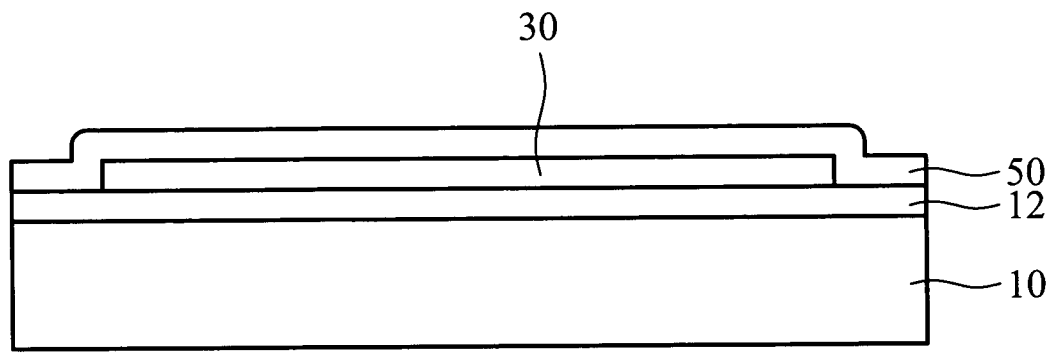
Figure 3D:
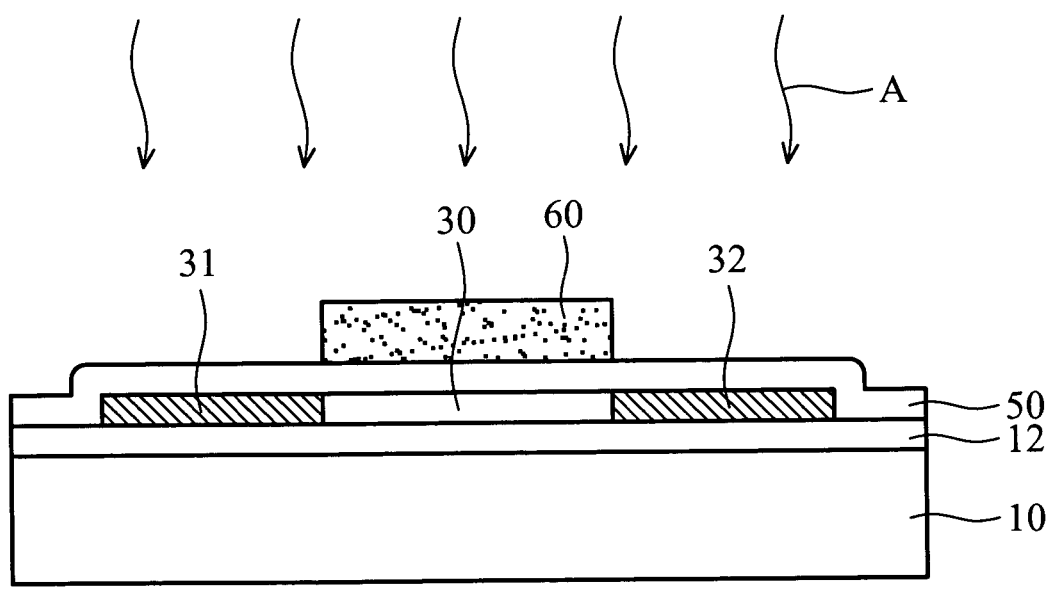

Subsequently, referring to FIG. 3c, a gate dielectric layer 50 is formed on the polysilicon layer 30. Next, referring to FIG. 3d, a metal layer (not shown) is formed on the gate dielectric layer 50 and then is subjected to photolithography and etching to form a gate layer 60. Next, the polysilicon layer 30 is doped using the gate layer 60 as a mask to form source/drain regions 31 and 32.

Figure 3E:
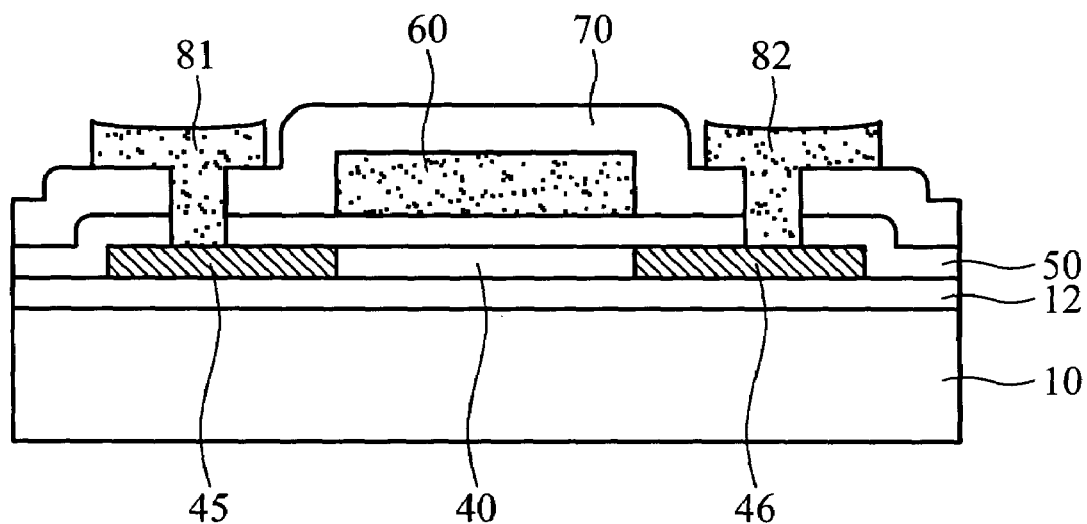

Subsequently, the passivation of the present invention is performed. That is, annealing (A) using a fluorine-containing gas, a chlorine-containing gas, an oxygen-containing gas, a nitrogen-containing gas, or mixtures thereof is performed, thus passivating the polysilicon layer 30 to form a passivated polysilicon layer 40 (as shown in FIG. 3e). At the same time, the source/drain regions 31 and 32 can be activated to form activated source/drain regions 45 and 46. The annealing step (A) is preferably high pressure annealing, preferably performed at a pressure higher than 1 atm, more preferably at a pressure of 1 atm to 20 atm, most preferably at a pressure of 2 atm to 20 atm. Moreover, the high pressure annealing is preferably performed at a temperature of 300° C. to 600° C. Fluorine-containing gas suitable for use in the present invention can be $NF_3$ and $F_2$, a suitable chlorine-containing gas can be $Cl_2$, a suitable oxygen-containing gas can be $O_2$, and a suitable nitrogen-containing gas can be $N_2O$. Since F forms a strong bond with Si, and the bond is resistant to high temperature, it is particularly suitable to use $NF_3$, $F_2$, or a mixture thereof in the present invention to passivate the polysilicon layer 30.

In this embodiment, the high pressure annealing is performed to passivate the polysilicon layer 30 after the polysilicon layer 30, the gate dielectric layer 50, the gate 60, and the source/drain regions 31 and 32 are formed. Thus, the broken bonds at the polysilicon layer 30 and the broken bonds at the interface between the gate dielectric layer 50 and the polysilicon layer 30, which are formed during the formation of the polysilicon layer 30, are passivated. Moreover, the source/drain regions 31 and 32 can be activated simultaneously, so as to repair damage due to ion implantation. Therefore an additional activation procedure can be omitted.

Subsequently, referring to FIG. 3e, an interlayer dielectric layer 70 is formed and an opening is formed in the interlayer dielectric layer 70 reaching the activated source/drain regions 45 and 46. Next, metal is filled in the opening of the interlayer dielectric layer 70 to form source/drain electrodes 81 and 82.

In conclusion, the present invention uses a fluorine-containing gas, a chlorine-containing gas, an oxygen-containing gas, a nitrogen-containing gas, or mixtures thereof to perform high pressure annealing to passivate the polysilicon layer. F, N, or O forms a strong bond with the silicon atom and can withstand the subsequent high temperature process. Therefore, the passivation of the present invention can be performed directly after amorphous silicon is crystallized to form polysilicon. Thus, the passivation efficiency is greatly increased. Moreover, the strong bond between F, N, or O and the silicon atom also increases reliability during device operation. In addition, if the passivation is performed after the gate dielectric layer is formed, broken bonds at the interface between the gate dielectric layer and polysilicon can also be filled. If the passivation is performed after the source/drain regions are formed, the source/drain regions can also be activated, thus omitting additional activation procedure.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for passivating polysilicon, comprising the following steps:
   forming a polysilicon layer; and
   annealing using a fluorine-containing gas, a chlorine-containing gas, an oxygen-containing gas, or mixtures thereof to passivate the polysilicon layer in a single step, wherein the step of forming the polysilicon layer comprises forming an amorphous silicon layer, and crystallizing the amorphous silicon layer to convert the amorphous silicon layer into the polysilicon layer, and the annealing step is conducted at a pressure of 1 atm to 20 atm.

2. The process as claimed in claim 1, wherein the annealing step is conducted at a pressure of 2 atm to 20 atm.

3. The process as claimed in claim 1, wherein the annealing step is conducted at a temperature of 300° C. to 600° C.

4. The process as claimed in claim 1, wherein the annealing step uses a fluorine-containing gas.

5. The process as claimed in claim 4, wherein the fluorine-containing gas is NF3, F2, or a mixture thereof.

6. A process for fabricating a polysilicon thin film transistor, comprising the following steps:
   forming a polysilicon layer on a substrate; and
   annealing using a fluorine-containing gas, a chlorine-containing gas, an oxygen-containing gas, or mixtures thereof to passivate the polysilicon layer in a single step, wherein the step of forming the polysilicon layer comprises forming an amorphous silicon layer, and crystallizing the amorphous silicon layer to convert the amorphous silicon layer into the polysilicon layer, and the annealing step is conducted at a pressure of 1 atm to 20 atm.

7. The process as claimed in claim 6, wherein the annealing step is conducted at a pressure of 2 atm to 20 atm.

8. The process as claimed in claim 6, wherein the annealing step is conducted at a temperature of 300° C. to 600° C.

9. The process as claimed in claim 6, wherein after the polysilicon layer is formed, the passivation step is directly performed without forming other films.

10. The process as claimed in claim 6, further comprising, after the polysilicon layer is formed and before the passivation step, the following step:
    forming a gate dielectric layer on the polysilicon layer.

11. The process as claimed in claim 10, further comprising, after the gate dielectric layer is formed and before the passivation step, the following step:
    forming a gate on the gate dielectric layer.

12. The process as claimed in claim 10, after the gate dielectric layer is formed and before the passivation step, further comprising the following step:
    doping the polysilicon layer to form a source/drain region.

13. The process as claimed in claim 12, wherein the annealing step simultaneously passivates the polysilicon layer and activates the source/drain region.

14. The process as claimed in claim 6, wherein the annealing step uses a fluorine-containing gas.

15. The process as claimed in claim 14, wherein the fluorine-containing gas is NF3, F2, or a mixture thereof.

16. A process for fabricating a polysilicon thin film transistor, comprising;
    forming a polysilicon layer on a substrate;

forming a gate dielectric layer on the polysilicon layer;
forming a gate on the gate dielectric layer;
doping the polysilicon layer to form source/drain regions by using the gate as a mask;
forming source/drain electrodes for the source/drain regions respectfully; and
annealing using a fluorine-containing gas, a chlorine-containing gas, an oxygen-containing gas, or mixtures thereof to passivate the polysilicon layer in a single step.

* * * * *